United States Patent
Voss et al.

(10) Patent No.: US 9,680,042 B2
(45) Date of Patent: Jun. 13, 2017

(54) PLATED ELECTRICAL CONTACTS FOR SOLAR MODULES

(71) Applicant: Atotech Deutschland GmbH, Berlin (DE)

(72) Inventors: Torsten Voss, Glienicke (DE); Sven Lamprecht, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 152 days.

(21) Appl. No.: 14/650,342

(22) PCT Filed: Dec. 16, 2013

(86) PCT No.: PCT/EP2013/076771
§ 371 (c)(1),
(2) Date: Jun. 8, 2015

(87) PCT Pub. No.: WO2014/111216
PCT Pub. Date: Jul. 24, 2014

(65) Prior Publication Data
US 2015/0318428 A1    Nov. 5, 2015

(30) Foreign Application Priority Data
Jan. 17, 2013 (EP) .................... 13151680

(51) Int. Cl.
*H01L 21/00* (2006.01)
*H01L 31/05* (2014.01)

(52) U.S. Cl.
CPC ...... *H01L 31/0516* (2013.01); *H01L 31/0508* (2013.01); *H01L 31/0512* (2013.01); *H01L 2224/18* (2013.01); *H01L 2924/3512* (2013.01); *Y02E 10/50* (2013.01)

(58) Field of Classification Search
None
See application file for complete search history.

(56) References Cited

U.S. PATENT DOCUMENTS

| 6,670,271 B1 | 12/2003 | Subramanian et al. |
| 2011/0120531 A1* | 5/2011 | Nese .................. H01L 31/1804 136/251 |
| 2011/0315186 A1* | 12/2011 | Gee ................... H01L 31/1804 136/244 |

(Continued)

FOREIGN PATENT DOCUMENTS

| GB | 1553025 | 9/1979 |
| WO | 2006093023 | 9/2006 |
| WO | 2007058603 | 5/2007 |

OTHER PUBLICATIONS

Official Action for corresponding Chinese Application No. 201380070762.2 dated Apr. 18, 2016.

(Continued)

*Primary Examiner* — Shaun Campbell
(74) *Attorney, Agent, or Firm* — Renner, Otto, Boisselle & Sklar, LLP

(57) ABSTRACT

The present invention concerns a plating method for manufacturing of electrical contacts on a solar module wherein the wiring between silicon solar cells in a solar module is deposited by electroplating onto a conductive seed. The wiring between individual silicon solar cells comprises wiring reinforcement pillars which improve the reliability of said wiring.

16 Claims, 5 Drawing Sheets

(56) References Cited

U.S. PATENT DOCUMENTS

| | | | | |
|---|---|---|---|---|
| 2012/0024368 A1* | 2/2012 | Sauar | ................... | H01L 31/1864 |
| | | | | 136/256 |
| 2012/0103388 A1* | 5/2012 | Meakin | ..................... | B32B 7/14 |
| | | | | 136/244 |
| 2012/0298172 A1* | 11/2012 | Baert | .................... | H01L 31/048 |
| | | | | 136/244 |
| 2013/0180566 A1* | 7/2013 | Cho | ................ | H01L 31/022425 |
| | | | | 136/244 |
| 2015/0020877 A1* | 1/2015 | Moslehi | ............ | H01L 31/02244 |
| | | | | 136/256 |

OTHER PUBLICATIONS

PCT/EP2013/076771; PCT International Search Report and Written Opinion of the International Searching Authority dated Mar. 25, 2014.
PCT/EP2013/076771; PCT International Preliminary Report on Patentability mailed May 4, 2015.
PCT/EP2013/076771; PCT Written Opinion of the International Preliminary Examining Authority mailed Mar. 11, 2015.

* cited by examiner

PLATED ELECTRICAL CONTACTS FOR SOLAR MODULES

The present application is a U.S. National Stage Application based on and claiming benefit and priority under 35 U.S.C. §371 of International Application No. PCT/EP2013/076771, filed 16 Dec. 2013, which in turn claims benefit of and priority to European Application No. 13151680.9 filed 17 Jan. 2013, the entirety of both of which is hereby incorporated herein by reference.

FIELD OF THE INVENTION

The invention relates to a plating method for manufacture of electrical contacts between individual silicon solar cells of a solar module comprising an array of silicon solar cells.

BACKGROUND OF THE INVENTION

Solar modules are devices for conversion of sun light into electrical energy and comprise a one-dimensional array or a two-dimensional array of individual solar cells, for example an array of 1×10, 6×12 or 8×12 solar cells. The overall size of a solar module is for example 0.8×1.6 m or 1×1.6 m.

Silicon based solar cells comprise silicon single crystal cells ("solar silicon wafers"), poly crystalline silicon cells and amorphous silicon cells.

Such solar cells (2) are mounted onto a support substrate (5) such as a sandwich of a glass plate (6) and an encapsulant (7) such as a foil of ethylvinylacetate (EVA) or a silicone sheet which faces the sunlight during use of the solar module (1). Horizontal spacings (3) between individual solar cells (2) are present. The corresponding P-type and N-type diffusion regions of individual solar cells are electrically contacted by attaching wires, clamps or a combination thereof (4) on and between solar cells (2) (FIG. 1).

Different strategies are known for electrically contacting solar cells with each other: solar cells (2) already having attached a wiring portion to one or both sides are mounted onto the support substrate (5) and wires and/or clamps (4) are soldered or glued onto contact areas (8) on the solar cells (2) bridging the horizontal spacing (3) between two solar cells (2) attached to the substrate of a solar module (1). A method for connecting solar cells by clamps (4) is disclosed in US 2012/0160294 A1. The mechanical stability of wires and/or clamps (4) soldered onto contact areas of two silicon cells and bridging the horizontal spacing (3) between said two solar cells attached to a support substrate (5) is not always sufficient.

This is for example shown in FIG. 2: in case the at least two solar cells (2) and (2') are mounted on top of the encapsulant (7) (FIG. 2a) or are partially embedded into the encapsulant (7) (FIG. 2b), a height difference (9) between the surface of the at least two solar cells (2) and (2') opposite to the support substrate (5) and the encapsulant (7) results. The wiring and/or clamping (4) between two solar cells (2) and (2') is bended in the region between the edge of a solar cell (2) and (2') and the surface of the encapsulant (7) in order to mechanically support said wiring (4) (FIG. 2c). The bended wiring portion (10) has an increased internal stress and accordingly a decreased reliability in later use of the solar module (1) where for example large temperature differences of e.g. 50° C. promote formation of cracks (11) in the bended wiring portion (10) (FIG. 2d).

Furthermore, solder joints or joints between a solar cell (1) and the wiring and/or clamping (4) formed by an (electrically conductive) adhesive are also a source of malfunction of the solar module (1) during manufacture or later use of the solar module (1).

Document GB 1 553 025 A discloses a method for manufacture of a wiring on individual solar cells wherein grooves are formed in a silicon wafer and successively filled with aluminium. Said aluminium wiring is in direct contact with the side walls of the grooves formed in the silicon wafer. Accordingly, such an method is not applicable to the formation of a copper and/or copper alloy wiring between individual silicon solar cells because silicon and copper diffuse into each other and thereby the intrinsic properties of solar silicon material is altered in an unacceptable manner.

Document WO 2006/093023 A1 discloses a dual damascene plating method for the manufacture of microchips from individual silicon wafers.

Document EP 0 710 991 A1 discloses a method for connecting a group of solar cell elements with metal foil members on the back faces of the plurality of the solar cell elements arranged next to each other.

OBJECTIVE OF THE INVENTION

It is the objective of the present invention to provide a method for manufacture of electrical contacts made of copper or copper alloys between silicon solar cells in a solar module wherein the mechanical stability and reliability of such electrical contacts is increased. Furthermore, a direct contact of the electrical contacts made of copper or copper alloy with the side walls of the silicon solar cells must be avoided.

SUMMARY OF THE INVENTION

This objective is solved by a plating method for manufacturing of electrical contacts on a solar module, the method comprising, in this order, the steps of (i) providing an array of silicon solar cells mounted onto a support substrate, the silicon solar cells separated from each other by a horizontal spacing, and having an exposed surface comprising at least one contact area on each silicon solar cell, (ii) depositing a plating resist onto the exposed surface of the array of silicon solar cells and the horizontal spacing between the silicon solar cells, (iii) forming openings in the plating resist and thereby expose the at least one contact area on each silicon solar cell and at least one portion of the horizontal spacing between the silicon solar cells, (iv) forming a conductive seed layer on top of the plating resist and the openings formed in step (iii), (v) forming a copper or copper alloy layer on top of the conductive seed layer, and (vi) etching back those portions of the copper or copper alloy layer and the conductive seed layer sufficient to remove both the copper or copper alloy layer and the conductive seed layer from the plating resist leaving a copper or copper alloy layer in the openings formed in step (iii) and thereby forming a wiring between silicon solar cells and wire reinforcement pillars.

The solar modules manufactured by the plating method according to the present invention comprise a copper or copper alloy wiring section between silicon solar cells having wiring reinforcement pillars and bridging the horizontal spacing between said silicon solar cells. Said wiring section provides an electrical contact for each silicon solar cell of the solar module and has a sufficient mechanical stability and reliability. Solder joints and/or adhesives are not required to connect the wiring between solar cells with contact areas on each solar cell. A direct contact between the copper or copper alloy wiring section and wiring reinforcement pillars and the silicon solar cells is omitted by the method according to the present invention. Accordingly, undesired diffusion between silicon and copper or a copper alloy is suppressed.

DETAILED DESCRIPTION OF THE INVENTION

Figure 1:
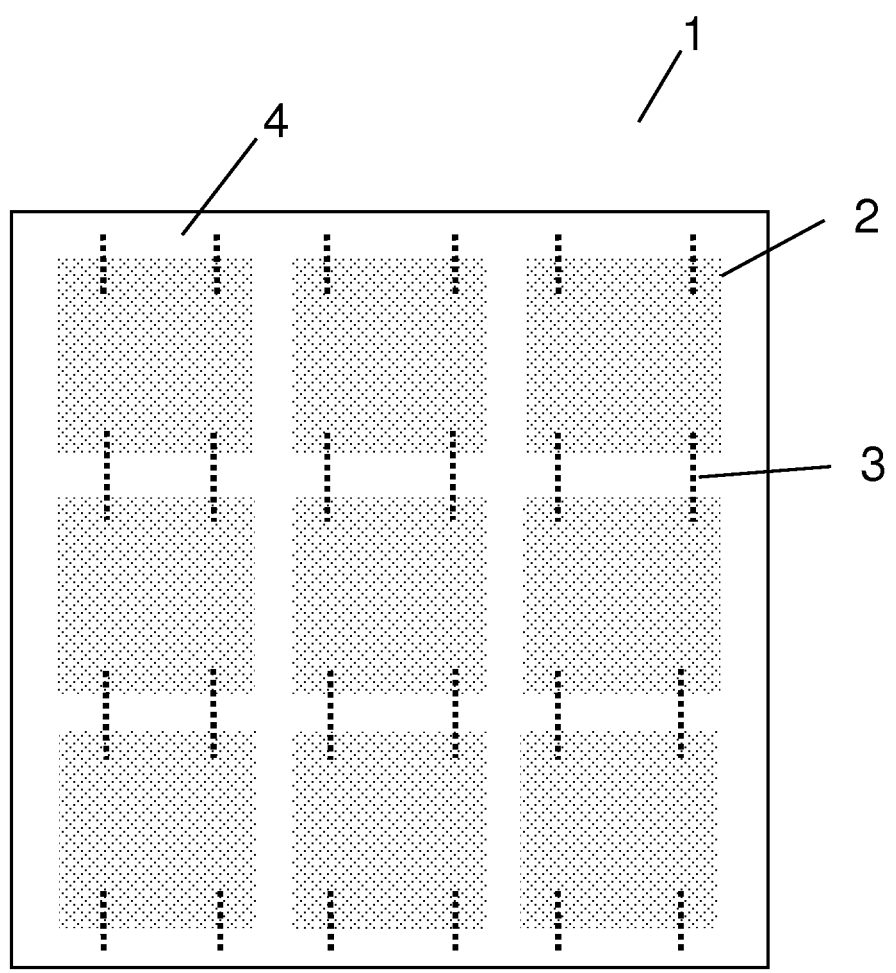
FIG. 1 shows a solar module comprising a two-dimensional array of silicon solar cells, a horizontal spacing between silicon solar cells and conductive lines on the silicon solar cells and the wiring between the silicon solar cells in top view (prior art).
Figure 2:
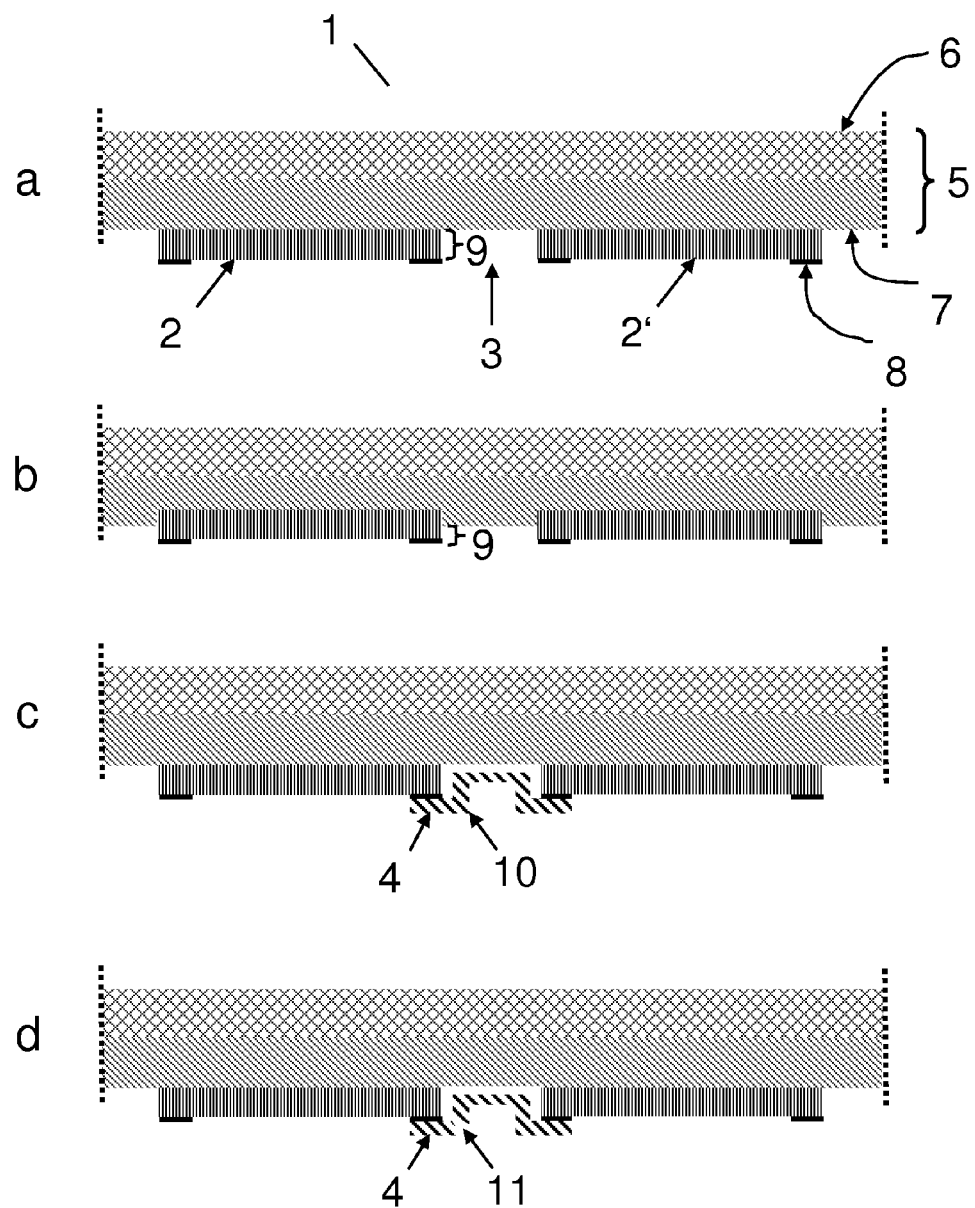
FIG. 2 shows a cross-section of a solar module with two silicon solar cells, the horizontal spacing between said two silicon solar cells and the wiring between said two silicon solar cells bridging the horizontal spacing (prior art).

The present invention provides a method for forming a patterned copper or copper alloy layer between silicon solar cells by plating, preferably electroplating. The method is particularly suitable for fabricating conductive lines on solar modules comprising at least two silicon solar cells. The method is in more detail described below.

The figures shown herein are simply illustrative of the process. The figures are not drawn to scale, i.e. they do not reflect the actual dimensions or features of the solar module. Like numbers refer to like elements throughout the description.

A solar module (101) comprising at least two silicon solar cells (102) and (102') mounted on a support substrate (104) is provided (FIG. 3a). The support substrate (104) may comprise a glass plate or a plastic material (105) and an encapsulant (106). The encapsulant is most often a sheet made of ethylvinylacetate (EVA) or a silicone material.

The support substrate (104) of a solar module (101) comprising flexible silicon solar cells (102) may comprise a flexible material such as a suitable polymer material instead of a glass plate (105).

The silicon solar cells (102) are for example single crystalline silicon solar cells (solar silicon wafers) and poly crystalline silicon solar cells, thin film silicon solar cells such as amorphous silicon solar cells or any other flexible solar module design.

Most preferably, the silicon solar cells (102) are silicon-based back-contact cells wherein all of the wiring on and between individual cells is attached to the backside of the silicon solar cells (102).

The at least two silicon solar cells (102) and (102') comprise at least one contact area (107) on the silicon solar cell side opposite to the silicon solar cell side facing the substrate (104).

A horizontal spacing (103) separates the at least two silicon solar cells (102) and (102') mounted on the support substrate (104). The horizontal spacing (103) preferably may have a width in the range of 0.5 to 25 mm, more preferably from 1 to 20 mm.

Different types of a contact area (107) can be used in the method according to the present invention. The contact area (107) is defined herein as a portion of a silicon solar cell (102) surface which is subjected to deposition of copper or copper alloy layer(s) thereon in later process steps. Accordingly, the contact area (107) provides a plateable surface and suppresses undesired inter diffusion between the silicon solar cell and the electrical contacts made of copper or a copper alloy which are formed by the method according to the present invention.

A first type of contact area (107) is the surface of a single crystal solar silicon wafer and a poly crystalline silicon solar cell, or portions of said surface, particularly consisting of doped silicon. For example, deposition of a nickel alloy layer such as a nickel phosphorous alloy layer by electroless plating onto a highly n-doped silicon surface can be achieved.

A second type of a suitable contact area (107) is a thin metal layer such as an aluminium layer which may be deposited by a vapour phase deposition method such as physical vapour deposition or by electroless plating onto the silicon solar cell (102). The contact area (107) may also be a multilayer stack of more than one individual metal and metal alloy layer, such as an aluminium layer attached to the silicon solar cell (102) followed by a barrier layer such as a tungsten-tantalum alloy layer or a nickel (alloy) layer and attached thereon a copper layer as the outermost layer of the contact area (107). A contact area (107) comprising copper is separated from the surface of a silicon solar cell (102) by a barrier layer to prevent undesired inter diffusion between copper and the silicon areas.

A third type of a suitable contact area (107) is a barrier layer which suppresses undesired diffusion of atoms between the silicon solar cell (102) and the conductive seed layer (111) and/or the copper or copper alloy layer (112). Such a barrier layer may be deposited onto the silicon solar cell (102) by electroless plating or a vapour phase deposition method such as physical vapour deposition. Materials suitable as a barrier layer are for example nickel, nickel alloys, such as nickel-phosphorous alloys, nickel-boron alloys, nickel-tungsten-phosphorous and nickel-molybdenum-phosphorous alloys, cobalt, cobalt alloys such as cobalt-tungsten-phosphorous alloys and cobalt-molybdenum-phosphorous alloys, chromium, titanium, tantalum, tungsten, silver, gold, palladium, and multilayers thereof.

A fourth type of a suitable contact area (107) is a transparent conductive oxide such as indium-doped tin oxide and aluminium-doped zinc oxide which can be deposited by a vapour phase deposition method or a wet chemical deposition method.

Figure 3:
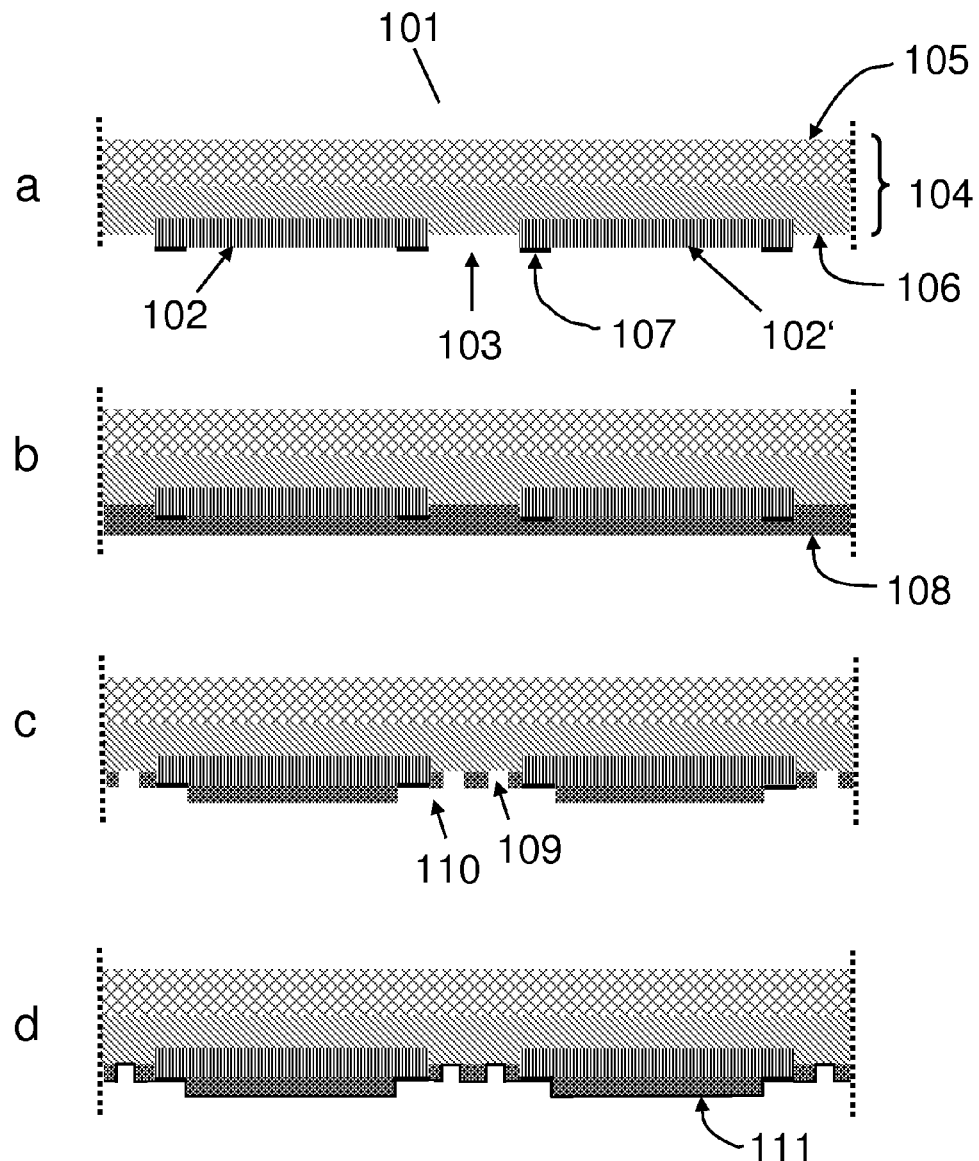
FIG. 3 shows the method for manufacture of conductive lines on silicon solar cells and wiring between silicon solar cells on a solar module according to the present invention.
Figure 3:
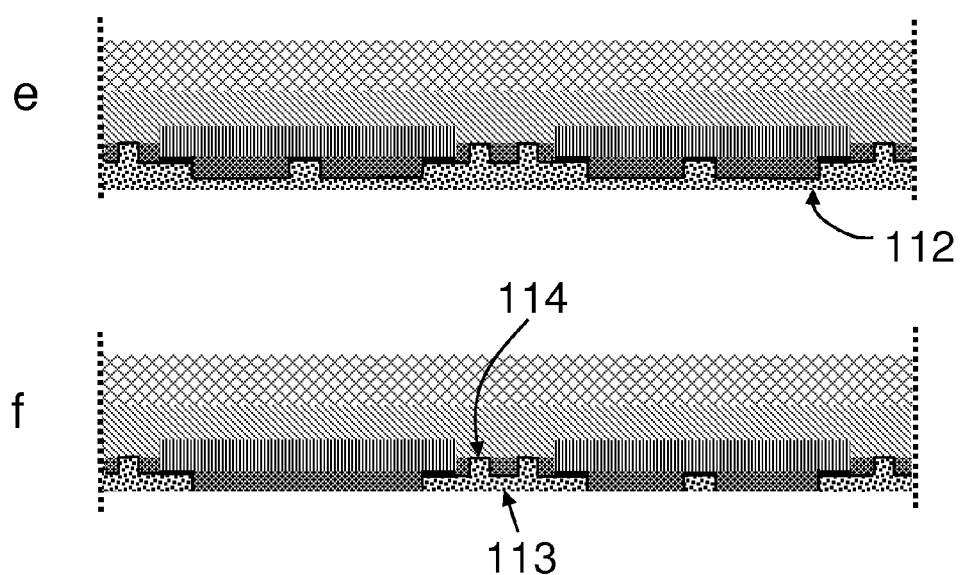

The contact area (107) may completely cover the surface of the silicon solar cell (102) or form a pattern on the surface of the silicon solar cell (102). In FIG. 3 patterned contact areas (107) on one side of a silicon solar cell (102) and (102') are shown.

Now referring to FIG. 3b: A plating resist layer (108) is deposited onto the exposed surface of the at least two silicon solar cells (102) and (102'), the contact area (107) and the encapsulant (106).

The plating resist layer (108) can be attached in form of a liquid resist material by e.g. dip coating, curtain coating, spray coating, roller coating or spin coating. Printable resist materials can be deposited by e.g. screen printing. Dry film resist materials may be laminated onto the surface of the at least two silicon solar cells (102) and (102'), the contact area (107) and the encapsulant (106). All such resist deposition methods are known in the art.

In case another deposition method is used to form the plating resist layer (108) other means for patterning, such as photo structuring, plasma erosion, and laser ablation may be applied. All these methods are known in the art.

At least two types of openings in the plating resist layer (108) are formed in the next step (FIG. 3c):
  a. first openings (109) are formed in the horizontal spacing (103) between at least two silicon solar cells (102) and (102') for the wiring reinforcement pillars (114) and
  b. second openings (110) are formed for the wiring (113) between at least two silicon solar cells (102) and (102') by exposing at least a portion of said contact areas (107). First openings (109) and second openings (110) may be manufactured from a single plating resist layer (108) by laser drilling.

First openings (109) and second openings (110) may also be formed from a single plating resist layer (108) by embossing.

First openings (109) may be formed in a first plating resist layer (108a) by screen printing, photo structuring or embossing followed by at least partially curing the patterned first plating resist layer (108a). Second openings (110) may then be formed by screen printing, photo structuring or embossing in a second plating resist layer (108b) deposited onto the patterned and at least partially cured first plating resist layer (108a). The viscosity of the plating resist material during deposition is adjusted to the structuring method employed which is a common procedure in the art.

The material used for the plating resist layer (108) must sustain the plating operations applied in step (iv) which may comprises treatment with acidic and alkaline liquids and/or oxidizing chemicals in case the conductive seed layer (111) is deposited by means of electroless plating. Deposition of the conductive seed layer (111) by other methods such as chemical vapour deposition or physical vapour deposition does not require such a resistance against acidic and alkaline liquids and/or oxidizing chemicals. Accordingly, the material of the plating resist layer (108) may also be an encapsulant material such as ethylvinylacetate (EVA) or a silicone material in case the conductive seed layer (111) is deposited by methods such as chemical vapour deposition or physical vapour deposition.

The plating resist layer (108) is selected from materials such as liquid resists, (screen) printable resists, and dry film resists.

Suitable polymers for the plating resist layer (108) are for example one or more of acrylates, ethylene/ethylacrylate copolymer (EEAC), ethylene/methacrylate copolymer (EMA), ethylene/acrylic acid copolymer (EAA), ethylene/butylacrylate copolymer (EBA), polymethylpentene (PMP) and polymethylmethacrylate (PMMA). Such materials are particularly preferred in case the conductive seed layer (111) is deposited by electroless plating.

More preferred polymer materials for the plating resist layer (108) are selected from the group consisting of acrylates and polymethylpentene.

Most preferred polymer material for the plating resist layer (108) are acrylates with a weight average molecular weight $M_w$ of 20,000 to 200,000 g/mol, more preferably from 25,000 to 150,000 g/mol, and most preferably from 30,000 to 100,000 g/mol. The Tg (glass temperature) of the polymer is preferably in the range of 20 to 130° C., more preferably from 30 to 120° C., and most preferably from 40 to 110° C., as measured according to ISO11357-1.

A molecular weight too high will lead to a reduced solubility in the chosen solvent. With a molecular weight too low, the sensitivity to the process solutions (acidic, alkaline, oxidizing) tends to be insufficient. The Tg must also not be too low because in this case the sensitivity to the substrate is insufficient at the elevated temperature of the processing chemicals.

Optionally, fillers can be incorporated into the polymeric material of the plating resist layer (108). Suitable fillers are preferably selected from the group consisting of aluminium borate, aluminium oxide, aluminium trihydroxide, anthracite, sodium antimonate, antimony pentoxide, antimony trioxide, apatite, attapulgite, barium metaborate, barium sulfate, strontium sulfate, barium titanate, bentonite, beryllium oxide, boron nitride, calcium carbonate, calcium hydroxide, calcium sulfate, carbon black, clay, cristobalite, diatomaceous earth, dolomite, ferrites, feldspar, glass beads, graphite, hydrous calcium silicate, iron oxide, kaolin, lithopone, magnesium oxide, mica, molybdenum disulfide, perlite, polymeric fillers such as PTFE, PE, polyimide, pumice, pyrophyllite, rubber particles, fumed silica, fused silica, precipitated silica, sepiolite, quartz, sand, slate flour, talc, titanium dioxide, vermiculite, wood flour, wollastonite, zeolites, zinc borate, zinc oxide, zinc stannate, zinc sulfide, aramid fibers, carbon fibers, cellulose fibers, glass fibers and mixtures thereof.

More preferably, optional filler materials for the plating resist layer (108) are selected from the group consisting of fused silica, fumed silica, precipitated silica, dolomite, kaolinite, talc, calcium carbonate, mica, feldspar, vermiculite, and pumice.

Most preferably, optional filler materials for the plating resist layer (108) are selected from the group consisting of kaolinite, talc, mica, and feldspar.

The amount of optional filler in the overall first resist material formulation after removal of the solvent is in the range of 1 to 70 wt.-%, more preferably 2 to 65 wt.-%, most preferably 3 to 60 wt.-%.

Depending on the solvent which is employed for formulating the resist material, the oven temperature and the drying time (curing of the resist material) have to be adjusted. The resulting hardness of the dried coating is important. Measurement of the hardness according to Koenig preferably should be in the range of 20 s to 200 s, more preferably 40 s to 180 s, most preferably 60 s to 160 s.

Now referring to FIG. 3d: a conductive seed layer (111) is deposited onto at least a portion of the contact area (107) exposed by the second openings (110), onto the outer surface of the patterned plating resist layer (108) and those portions of the encapsulant (106) which are exposed by the first openings (109).

The conductive seed layer (111) is required to initiate electroplating the metal or metal alloy layer (112) into the first openings (109), the second openings (110), onto at least a portion of the contact area (107), on top of the patterned plating resist layer (108) and those portions of the encapsulant (106) which are exposed by the first openings (109).

As the conductive seed layer (111) covers the entire surface of the plating resist (108), the first openings (109) and the second openings (110) a variation of the local electrical potential is not seen during electroplating of the copper or copper alloy layer (112). This kind of panel plating approach does not comprise isolated features such as conductive lines to be electroplated. The variation in layout (e.g.

position and size of first openings (109) and second openings (110)) has no impact on the local electrical potential anymore. The plated metal or metal alloy thickness distribution is now dependent on the thickness accuracy of the applied plating resist layer (108). This allows an increase of current density, as no isolated layout features are the limiting factor. An increase in plating speed shortens the required time for depositing the copper or copper alloy layer (112).

The conductive seed layer (111) is for example formed by electroless plating in the conventional manufacturing of non-conductive surfaces which is well known in the art.

Other suitable methods for depositing the conductive seed layer (111) are for example direct plating using an intrinsically conductive polymer, chemical vapour deposition (CVD), physical vapour deposition (PVD) and plasma enhanced chemical vapour deposition (PECVD). This methods are also known in the art.

Preferably, the conductive seed layer (111) is deposited by electroless plating.

The surface of the patterned plating resist layer (108) can also be activated for subsequent electroplating by various methods which are described, for example, in Printed Circuits Handbook, C. F. Coombs Jr. (Ed.), 6$^{th}$ Edition, McGraw Hill, pages 28.5 to 28.9 and 30.1 to 30.11. These processes involve the formation of a conductive layer comprising carbon particles, noble metal colloids, noble metal ions or electrically conductive polymers.

Subsequent electroless plating of a thin intermediate metal coating can optionally been carried out in order to enhance the conductive seed layer (111).

With assistance of the conductive seed layer (111), electroplating of the copper or copper alloy layer (112) according to the present invention can then be carried out.

The conductive seed layer (111) may be made of a single metal layer, a single metal alloy layer or of a multilayer of at least two distinct single layers. Metals and metal alloys suitable as conductive seed layer (111) are selected from the group consisting of copper, tin, cobalt, nickel, silver, tin alloys such as tin-lead alloy, tin-silver alloy, copper alloys such as copper-nickel alloy, copper-chromium alloy, copper-ruthenium alloy, copper-rhodium alloy, copper-silver alloy, copper-iridium alloy, copper-palladium alloy, copper-platinum alloy, copper-gold alloy and copper-rare earth alloy, copper-nickel-silver alloy, copper-nickel-rare earth metal alloy, nickel alloys such as nickel-phosphorous alloys and nickel-boron alloys, and cobalt alloys such as cobalt-tungsten-phosphorous alloys and cobalt-molybdenum-phosphorous alloys.

Copper, copper alloys, nickel and nickel alloys are most preferred as the conductive seed layer (111).

In accordance with a preferred embodiment of the present invention, said conductive seed layer (111) can also be formed by an electroless plating method, wherein the catalytic metal does not use noble metal but uses copper as the catalytic metal. The typical examples for forming such a catalytic copper on a non-conductive surface can be found in the U.S. Pat. No. 3,993,491 and U.S. Pat. No. 3,993,848.

The thickness of said conductive seed layer (111) preferably is less than 10 μm and more preferably between 0.1 and 5 μm.

Next, a copper or copper alloy layer (112) is preferably deposited by electroplating onto the conductive seed layer (111) (FIG. 3e).

Suitable copper and copper alloy electroplating bath compositions are known in the art. Commonly used copper or copper alloy plating bath compositions and process parameters for plating can be applied. A preferred copper plating bath composition comprises water, a source of copper ions, an acid such as sulfuric acid and/or methane sulfonic acid and one or more organic additives selected from the group consisting of brightener additives, carrier additives, leveler additives, and wetting agents. Other optional additives are for example halide ions such as chloride ions and a source of second metal ions in case a copper alloy should be deposited.

Since also the patterned plating resist layer (108) is covered by the conductive seed layer (111), electroplating of the copper or copper alloy layer (112) is also on this layer. The thickness of the copper or copper alloy layer (112) should preferably not exceed 10 μm and more preferably not exceed 6 μm on top of the patterned plating resist layer (108).

Both DC plating and reverse pulse plating can be used to deposit copper or a copper alloy as the copper or copper alloy layer (112) onto the conductive seed layer (111).

In one embodiment of the present invention, copper or a copper alloy are deposited from an aqueous plating bath further comprising $Fe^{3+}$ ions with reverse pulse plating and in the presence of insoluble anodes.

In step (vi) of the method according to the present invention, those parts of the copper or copper alloy layer (112) which are plated on top of the patterned plating resist layer (108) are etched away. At the same time, a similar amount (in terms of thickness of this layer) of the copper and copper alloy layer (112) plated into the second openings (110) is also etched away. Step (vi) of the method according to the present invention is illustrated in FIG. 3f.

In one embodiment of the present invention, no additional etch resist is applied onto the copper or copper alloy layer (112) above those portions of the copper or copper alloy layer (112) which later on form the wiring (113) between silicon solar cells (102) prior to removal of the copper or copper alloy layer (112).

The term "etch resist" is defined herein as any kind of patterned barrier, e.g., photo imageable or screen printed organic resists and metal etch resists which prevents undesired removal of metallic material beneath said etch resist during etching.

The removal is preferably performed by chemical etching an amount of the copper or copper alloy layer (112) sufficient to remove the copper or copper alloy layer (112) from the conductive seed layer (111) a wiring (113) between silicon solar cells (102) and wiring reinforcement pillars (114) beneath the wiring (113). Said wiring reinforcement pillars (114) beneath the wiring (113) are preferably perpendicular to the horizontal spacing (103) between two silicon solar cells (102) and (102') as shown in FIG. 3f. The wiring reinforcement pillars (114) may have the shape of a cylinder, a line or a portion of a line.

In one embodiment of the present invention, an amount of the copper or copper alloy layer (112) is removed by etching sufficient to remove also a portion of the copper or copper alloy layer (112) inside the second openings (110). This portion may preferably be 0.1 to 10 μm, more preferably 0.5 to 5 μm in terms of thickness of the copper or copper alloy layer (112) deposited inside the second openings (110).

Etching of the copper or copper alloy layer (112) can be performed electrolytically or chemically. Also, mechanical polishing may be applied alone or in combination with electrolytical or chemical stripping to remove the copper or copper alloy layer (112).

Typical etching or stripping compositions for the copper or copper alloy layers (112) and a conductive seed layer (111) consisting of copper or a copper alloy are for example disclosed in: C. F. Coombs, Jr., "Printed Circuits Handbook", 5th Ed. 2001, McGraw-Hill, Chapter 33.4.

Suitable etching solutions and etching conditions are chosen in routine experiments.

Next, those parts of the conductive seed layer (111) which are on top of the patterned plating resist layer (108) are removed in step (vi) by chemical and/or electrochemical etching (FIG. 3f).

The conductive seed layer (111) may be removed with the same methods as the copper or copper alloy layer (112) in step (v).

In one embodiment of the present invention the patterned plating resist layer (108) remains on solar module (101) and is utilized as an encapsulating material when sealing the backside of the solar module (101) in successive process steps.

Figure 4:
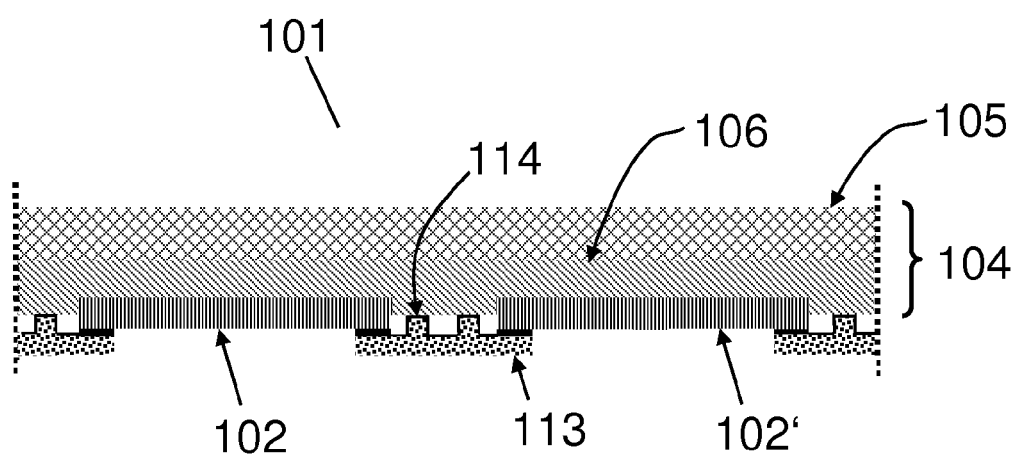
FIG. 4 shows an optional further step of the method for manufacture of conductive lines on silicon solar cells and the wiring between silicon solar cells on a solar module according to the present invention.

In another embodiment of the present invention the patterned plating resist layer (108) is removed after step (vi) in the method according to the present invention. A solar module (101) as shown in FIG. 4 is thereby obtained.

The patterned plating resist layer (108) can be removed (stripped) from the solar module (101) by contacting the patterned plating resist layer (108) with a solvent, the solvent preferably selected from the group comprising acetone, n-amylalcohol, n-amylacetate, benzyl alcohol, 1,4-butanediol, methoxybutyl acetate, n-butylacetate, sec-butyl acetate, n-butanol, 2-butanol, butyldiglycol, butyldiglycol acetate, diethyleneglycol dibutylether, butylglycol, butylgycol acetate, n-butyltriglycol, chloroform, cyclohexane, cyclohexanol, cyclohexanone, cyclohexylamine, n-decane, decahydro naphthalene, diacetone alcohol, 1,2-dichloroethane, 1,2-dichlorobenzene, 1,2-dichloropropane, diethanolamine, diethylene glycol, diethyleneglycol dibutylether, diethyleneglycol diethylether, diethyleneglycol dimethylether, diethyleneglycol monobutylether, diethyleneglycol monobutylether acetate, diethyleneglycol monoethylether, diethyleneglycol monomethylether, diethyleneglycol momethylether acetate, diethylether, diethylketone, diethyleneglycol dimethylether, diisobutylketone, diisopropylamine, diisopropanolamine, diisopropylether, di methylacetamide, dimethylformamide, di methylsulfoxide, 1,4-dioxane, dipentene, dipropyleneglycol, dipropyleneglycol monobutylether, dipropyleneglycol monomethylether, n-dodecane, propyleneglycol diacetate, propyleneglycol monomethylether, propyleneglycol monomethylether acetate, propyleneglycol monobutylether, propyleneglycol monobutylether acetate, tripropyleneglycol monomethylether, tripropyleneglycol monobutylether, ethyl-3-ethoxypropionate, ethanolamine, propyleneglycol monoethylether, ethoxypropyl acetate, ethylacetate, ethaylamylketone, ethylbenzene, 2-ethylbutanol, ethylbutyl ketone, ethyldiglycol, ethyldiglycol acetate, 1,2-dichloroethane, ethyleneglycol, ethyleneglycol diethylether, ethyleneglycol dimethylether, ethyleneglycol monobutylether, ethyleneglycol monobutylether acetate, ethyleneglycol monoethylether, ethyleneglycol monoethylether acetate, ethyleneglycol monoisopropylether, ethyleneglycol monomethylether, ethyleneglycol monomethylether acetate, ethyleneglycol monopropylether, ethylformate, ethylglycol, ethylglycol acetate, ethyleneglycol dietehylether, 2-ethoxyethanol, 2-ethylhexyl acetate, ethylactate, ethylmethylketone, formic acid, ethylmethyleketoxime, ethyltriglycol, furfurol, furfurylalcohol, furfurylaldehyde, glycerol, glycerol triacetate, n-heptane, n-hexadecane, n-hexane, hexylene glycol, isoamylacetate, isoamylalcohol, isobutylacetate, isobutylalcohol, isoheptane, isooctane, isopentane, isophorone, isopropanolamine, isopropylacetate, isopropylalcohol, isopropylchloride, isopropylether, isopropylglycol, methoxypropyl acetate, methylacetate, methyl alcohol, methylamylketone, methylbutylketone, methylcyclohexane, methylcyclohexanol, methylcyclohexanone, methylcyclopentane, methyldiglycol, methyldiglycol acetate, methylenechloride, acetic acid, methylethylketone, methylethyl ketoxime, methylglycol, methylglycol acetate, methylisoamylalcohol, methylisoamylketone, methylisobutylcarbinol, methylisobutylketone, methylisopropylketone, methylpropylketone, N-methylpyrrolidone, methyl-t-butylether, monochlorobenzene, monoethanolamine, monoisopropanolamine, nitroethane, nitromethane, 1-nitropropane, 2-ntropropane, n-nonane, n-octane, n-octylalcohol, n-pentadecane, pentylpropionate, perchloroethylene, n-propylacetate, n-propanol, propylenedichloride, propyleneglycol, propyleneglycol diacetate, propyleneglycol monobutylether, propyleneglycol monobutyletheracetate, propyleneglycol monoethylether, propyleneglycol monomethylether, propyleneglycol monomethylether acetate, propylglycol, pyridine, sec-butylacetate, n-tetradecane, tetraethyleneglycol, tetraethyleneglycol di methylether, tetrahydrofuran, tetrahydrofurylalcohol, tetrahydro naphthalene, toluene, trichloroethane, trichloroethylene, n-tridecane, triethanolamine, triethyleneglycol, triethylenglycol monoethylether, triethyleneglycol dimethylether, tripropyleneglycol, hydrogenperoxide, tripropylengylcol monobutylether, tripropyleneglycol monomethylether, n-undecane, xylene, mesitylene, acetophenone, acetaldehyde, butyrolactone, ethylenecarbonate, propylenecarbonate, acetonitrile, butyronitrile, M-ethylpyrrolidone, and mixtures thereof. Such solvents or mixtures of the aforementioned solvents may further comprise water.

More preferably, the solvent is selected from the group consisting of benzyl alcohol, formic acid, dimethylacetamide, dimethylformamide, cyclohexanone, ethanolamine, triethanolamine, ethyleneglycol monobutylether acetate, ethyleneglycol monoethylether, and mixtures thereof.

Most preferably, the solvent is selected from the group consisting of formic acid, benzyl alcohol, ethyleneglycol monobutylether acetate, ethyleneglycol monoethylether and mixtures thereof.

The solvent or mixture of solvents may be mixed with water prior to the removal of the patterned resist layer (108).

The patterned plating resist layer (108) is contacted with the solvent by immersion, spraying, or dipping. For stripping purpose, the solvent is preferably held at a temperature in the range of 5 to 100° C., more preferably 10 to 90° C. and most preferably 15 to 80° C. The contact time during stripping preferably ranges from 1 to 600 s, more preferably from 10 to 540 s and most preferably from 20 to 480 s.

The wiring (113) between silicon solar cells (102) of a solar module (101) can be manufactured in one process sequence with the plating method for manufacturing of electrical contacts on a solar module (101) according to the present invention.

In still another embodiment of the present invention, the wiring on top of an individual silicon solar cell (102) of a solar module (101) can be manufactured simultaneously:

Additional third openings are formed in the plating resist layer (108) on top of the silicon solar cell (102) in step (iii). Such third openings preferably have the shape of trenches. Next, said third openings are also covered by the conductive seed layer (111) in step (iv) and are then filled with the copper or copper alloy (112) in step (v). The copper or copper alloy filled into the third openings then serve as the "internal" wiring required for each individual silicon solar cell (102). This embodiment of the present invention enables manufacture of wiring for each individual silicon solar cell (102) and the wiring between individual silicon solar cells (102) in one and the same process sequence.

Accordingly, whole solar modules (101) comprising several silicon solar cells (102) can be processed as such in order to deposit all required electrical contacts on silicon solar cells and between silicon solar cells of a solar module. Furthermore, the wiring (113) between silicon solar cells (102) comprises wiring reinforcement pillars (114) which make such wiring (113) more reliable compared to manufacturing methods according to prior art.

No direct contact with parts (e.g. the side walls) of the silicon solar cells (102) and the copper or copper alloy layer (112) are formed by the method according to the present invention. Accordingly, also undesired diffusion between copper or a copper alloy (112) and silicon from the silicon solar cells (102) is suppressed by the method according to the present invention.

The invention claimed is:

1. A plating method for manufacturing of electrical contacts on a solar module, the method comprising, in this order, the steps of
    (i) providing an array of silicon solar cells mounted onto a support substrate, the silicon solar cells separated from each other by a horizontal spacing, and having an exposed surface comprising at least one contact area on each silicon solar cell,
    (ii) depositing a plating resist onto the exposed surface of the array of silicon solar cells and the horizontal spacing between the solar cells,
    (iii) forming openings in the plating resist and thereby expose the at least one contact area on each silicon solar cell and at least one portion of the horizontal spacing between the silicon solar cells,
    (iv) forming a conductive seed layer on top of the plating resist and the openings formed in step (iii),
    (v) forming a copper or copper alloy layer on top of the conductive seed layer, and
    (vi) etching back those portions of the copper or copper alloy layer and the conductive seed layer sufficient to remove both the copper or copper alloy layer and the conductive seed layer from the plating resist leaving a copper or copper alloy layer in the openings formed in step (iii) and thereby forming a wiring between silicon solar cells and wiring reinforcement pillars.

2. The method according to claim 1 wherein the silicon solar cells are single crystalline silicon solar cells, poly crystalline silicon solar cells or amorphous silicon solar cells.

3. The method according to claim 1 wherein the silicon solar cells are silicon-based back-contact cells wherein all of the wiring on and between individual cells is attached to the backside of the silicon solar cells.

4. The method according to claim 1 wherein the support substrate consists of a glass layer and an encapsulant which is in contact with the array of silicon solar cells.

5. The method according to claim 1 wherein the horizontal spacing width ranges from 0.5 to 20 mm.

6. The method according to claim 1 wherein the plating resist is deposited by a method selected from curtain coating, screen printing, roller coating, dry lamination and spray coating.

7. The method according to claim 1 wherein the plating resist comprises one or more of acrylates, ethylene/ethylacrylate copolymer, ethylene/methacrylate copolymer, ethylene/acrylic acid copolymer, ethylene/butylacrylate copolymer, polymethylpentene, and polymethylmethacrylate.

8. The method according to claim 1 wherein the plating resist comprises a filler selected from the group consisting of aluminium borate, aluminium oxide, aluminiumtrihydroxide, anthracite, sodium antimonate, antimony pentoxide, antimony trioxide, apatite, attapulgite, barium metaborate, barium sulfate, strontium sulfate, barium titanate, bentonite, beryllium oxide, boron nitride, calcium carbonate, calcium hydroxide, calcium sulfate, carbon black, clay, cristobalite, diatomaceous earth, dolomite, ferrites, feldspar, glass beads, graphite, hydrous calcium silicate, iron oxide, kaolin, lithopone, magnesium oxide, mica, molybdenum disulfide, perlite, polymeric fillers such as PTFE, PE, polyimide, pumice, pyrophyllite, rubber particles, fumed silica, fused silica, precipitated silica, sepiolite, quartz, sand, slate flour, talc, titanium dioxide, vermiculite, wood flour, wollastonite, zeolites, zinc borate, zinc oxide, zinc stannate, zinc sulfide, aramid fibers, carbon fibers, cellulose fibers, and glass fibers, and mixtures thereof.

9. The method according to claim 1 wherein the conductive seed layer is formed by a method selected from the group consisting of electroless plating, direct plating, physical vapour deposition, chemical vapour deposition and plasma enhanced chemical vapour deposition.

10. The method according to claim 1 wherein the conductive seed layer is selected from the copper, copper alloys, nickel and nickel alloys.

11. The method according to claim 1 wherein the copper or copper alloy layer is deposited by electroplating.

12. The method according to claim 1 wherein the patterned plating resist layer is removed after step (vi).

13. The method according to claim 1 wherein, in step (iii), first openings are formed in the horizontal spacing between at least two of the silicon solar cells for the wiring reinforcement pillars and second openings are formed for the wiring between the at least two silicon solar cells by exposing at least a portion of the contact areas.

14. The method according to claim 1 wherein, in step (iv), the conductive seed layer is deposited onto at least a portion of the contact area exposed by the second openings, onto the outer surface of the patterned plating resist layer and onto those portions of the encapsulant which are exposed by the first openings.

15. The method according to claim 1 wherein no direct contact with the side walls of the silicon solar cells and the copper or copper alloy layer is formed.

16. The method according to claim 1,
    wherein, in step (iii), first openings are formed in the horizontal spacing between at least two of the silicon solar cells for the wiring reinforcement pillars and second openings are formed for the wiring between the at least two silicon solar cells by exposing at least a portion of the contact areas;
    wherein, in step (iv), the conductive seed layer is deposited onto at least a portion of the contact area exposed by the second openings, onto the outer surface of the patterned plating resist layer and onto those portions of the encapsulant which are exposed by the first openings; and
    wherein no direct contact with the side walls of the silicon solar cells and the copper or copper alloy layer is formed.

* * * * *